United States Patent [19]

Bailey et al.

[11] 4,096,582

[45] Jun. 20, 1978

[54] FIELD-ACCESSED MAGNETIC BUBBLE MUTUALLY EXCLUSIVE CIRCUITS WITH COMMON ELEMENTS

[75] Inventors: Paul T. Bailey, Creve Coeur; L. John Doerr, III, St. Louis; Robert M. Sandfort, St. Charles, all of Mo.

[73] Assignee: Monsanto Company, St. Louis, Mo.

[21] Appl. No.: 474,776

[22] Filed: May 30, 1974

[51] Int. Cl.² ............................................. G11C 19/08
[52] U.S. Cl. ...................................... 365/13; 365/15; 365/26; 365/39
[58] Field of Search ................................. 340/174 TF

[56] References Cited

U.S. PATENT DOCUMENTS

| | | | |
|---|---|---|---|
| 3,702,991 | 11/1972 | Bate et al. | 340/174 TF |
| 3,713,119 | 1/1973 | Bobeck | 340/174 TF |
| 3,786,447 | 1/1974 | Yamauchi | 340/174 TF |
| 3,848,239 | 11/1974 | Clover, Jr. | 340/174 TF |
| 3,879,716 | 4/1975 | Bailey et al. | 340/174 TF |
| 3,896,421 | 7/1975 | Flannery | 340/174 TF |
| 3,934,236 | 1/1976 | Aiken et al. | 340/174 TF |
| 3,940,751 | 2/1976 | Sandfort | 340/174 TF |

OTHER PUBLICATIONS

IBM Technical Disclosure Bulletin - vol. 13, No. 10, Mar. 1971, pp. 3064-3065.
IBM Technical Disclosure Bulletin - vol. 15, No. 7, Dec. 1972, pp. 2093-2095.
IBM Technical Disclosure Bulletin, vol. 13, No. 11, Apr. 1971, pp. 3290-3291.

*Primary Examiner*—James W. Moffitt
*Attorney, Agent, or Firm*—Lane, Aitken, Dunner & Ziems

[57] ABSTRACT

Composite mutually exclusive field-accessed circuit elements common to a plurality of bubble paths. A channel composed of mutually exclusive circuit elements is linked to an adjacent parallel channel of mutually exclusive circuit elements by means of circuit element portions common to both channels. The interconnected channels are operated mutually exclusively by means of corresponding pulsed field sequences. Transfer between the linked channels is via the common circuit element portion. Several new types of propagation circuits are also discussed along with organizations for mutually exclusive major and minor closed loops featuring controlled transfer via common circuit element portions.

33 Claims, 32 Drawing Figures

FIELD-ACCESSED MAGNETIC BUBBLE MUTUALLY EXCLUSIVE CIRCUITS WITH COMMON ELEMENTS

BACKGROUND OF THE INVENTION

The invention relates generally to the field of magnetic bubble technology (MBT) and, more particularly, to means for propagating or transmitting magnetic bubbles, especially in field-accessed mutually exclusive propagation channels.

MBT involves the creation and manipulation of magnetic bubbles in specially prepared magnetic materials. The word "bubble", used throughout this text is intended to encompass any single-walled magnetic domain, defined as a domain having an outer boundary which closes on itself. The application of a static, uniform magnetic bias field orthogonal to a sheet of magnetic material having suitable uniaxial anisotropy causes the normally random serpentine pattern of magnetic domains to shrink into isolated, short cylindrical configurations or bubbles whose common polarity is opposite that of the bias field. The bubbles repel each other and can be moved or propagated by a magnetic field in the plane of the sheet.

Many schemes exist for propagating bubbles along predetermined channels. These techniques can be classed generally as conductor-accessed and field-accessed. In conductor-accessed propagation systems, electrically pulsed conductive loops are disposed in series over the magnetic sheet. In field-accessed propagation systems electrical conductors are not disposed on the magnetic sheet for propagation; instead, an overlay pattern of ferromagnetic elements establishes a bubble propagation channel in which a sequence of attracting poles is caused to be formed in the presence of a continuous, uniformly rotating magnetic drive field in the plane of the sheet.

A major distinction in function between conductor-accessed and field-accessed circuits is that several conductor-accessed circuits can be disposed on the same sheet or "bubble chip" and operated completely separately and exclusively from each other while field-accessed circuits on the same chip all operate at the same time under the control of an ubiquitous uniformly rotating, common drive field.

One attempt at providing field-accessed channel selection is shown in U.S. Pat. No. 3,543,252 to Perneski illustrating several variations on the familiar T-bar circuit to which different permutations of pulsed orthogonal drive fields are applied.

MBT can be used in data processing because magnetic bubbles can be propagated through channels, whether field-acessed or conductor-accessed, at a precisely determined rate so that uniform data streams of bubbles are possible in which the presence or absence of a bubble at a particular position within the stream indicates a binary "1" or "0". Because of its potential for low cost, low power consumption and extremely high bit density, MBT is under active consideration for use in large scale memories of moderate speed. One of the prime design elements of many memory systems utilizing field-accessed magnetic bubbles is the provision of a closed loop bubble path which can be used as a recirculating "shift register". Many memory arrangements of this type employ a plurality of "minor" loops selectively interconnectible with a "major" loop such that bubbles can be transferred between the major and minor loops on command.

The ability to propagate bubbles in one or more recirculating loops without operating other loops on the same chip has until recently been confined to systems employing conductor-accessed circuits. Mutually exclusive closed loop field-accessed bubble propagation circuits are disclosed in copending application Ser. No. 432,450, now U.S. Pat. No. 4,021,790 by Howard H. Aiken, Paul T. Bailey and Robert C. Minnick, entitled "Mutually Exclusive Magnetic Bubble Propagation Circuits" filed Jan. 11, 1974. Discrete mutually exclusive circuit elements and systems composed of them are disclosed in copending application Ser. No. 448,649, now U.S. Pat. No. 3,879,716 by Paul T. Bailey and L. John Doerr III, entitled "Mutually Exclusive Magnetic Bubble Propagation Circuits With Discrete Elements", filed Mar. 6, 1974. Bubble paths having rectangular and parallelogram geometries are disclosed in copending application Ser. No. 455,275, U.S. Pat. No. 3,940,751 by Robert M. Sandfort, entitled "Mutually Exclusive Parallel-Sided Bubble Circuits", filed Mar. 27, 1974. These three copending applications are assigned to the assignee of this application and incorporated herein by reference.

In bubble circuit design, the need often arises for controllably transferring bubbles on one path to another path, for example, from a minor to a major loop in a memory organization. One transfer technique in field-accessed systems is to employ one or more conductor loops which can be pulsed on command to attract bubbles on one path to an alternate path. Another approach to bubble transfer involves the use of conductors plus special field-accessed transfer elements. See, for example, Smith et al, "Dollar Sign Transfer for Magnetic Bubbles" (Paper No. 13.2), 1973 Intermag Conference; U.S. Pat. No. 3,714,639 to Kish et al, and U.S. Pat. Nos. 3,613,058, 3,618,054 and 3,713,116 to Bonyhard et al; and Bosch et al, "1024 - bit Bubble Memory Chip" (Paper No. 26.2), 1973 Intermag Conference. Of course, if conductors are involved at all, the overlay pattern becomes more difficult to implement.

Specific field-accessed transfer systems have been previously described. In Michaelis et al "Magnetic Bubble Repertory Dialer Memory", IEEE Trans. Mag., September 1971, p. 737, minor/major loop transfer "gates" are described which can be simultaneously activated by reverse rotation of the drive field. Distinct T-bar loops are joined by specially designed transfer elements. Propagation on the major and minor loops cannot be reversed without transfering bubbles. Bonyhard et al, "Applications of Bubble Devices", IEEE Trans. Mag., MAG-6, No. 3, Sept. 1970, p. 447 (FIG. 1), also discusses "reverse propagation transfer". The Bonyhard article also describes a different field-accessed transfer gate using magnetically "hard" transfer elements and special drive field pulses for transfer.

Segments of two circuit elements have been joined together before. For example, adjacent T-bar channels often utilize double-T or I-bar configurations, as shown in the Michaelis article, supra, and elsewhere. U.S. Pat. No. 3,713,119 to Bobeck describes a particular circuit which represents a modification of T-bar and Y-bar circuit elements and has common segments pairing the elements.

SUMMARY OF THE INVENTION

One of the objects of the invention is to permit controlled transfer between mutually exclusive field-accessed bubble propagation paths. Another object of the invention is to form composite circuit elements belonging to a plurality of distinct, mutually exclusive bubble propagation paths. A further object of the invention is to implement newly discovered circuit elements to form mutually exclusive bubble propagation paths. Still another object of the invention is to permit controlled transfer of bubbles between two portions of a composite circuit element corresponding to distinct mutually exclusive bubble paths.

The term "mutually exclusive circuit element" as used herein, means any one of at least two kinds of analogous elements, where a channel composed of one kind of element propagates bubbles by means of a corresponding set of sequential drive field orientations which does not propagate bubbles on a channel composed of the other kind of element, and vice versa, where both kinds of elements bear the same geometrical relationship to the corresponding sets of field orientations which drive them.

Using mutually exclusive circuit elements, some novel and some previously disclosed, the applicants have discovered that mutually exclusive circuit elements can be joined in a manner which not only facilitates an efficient sharing of portions common to both elements but also permits transfer between distinct mutually exclusive circuits. By arranging the composite circuit elements in series, parallel, interconnected bubble paths may be formed which are mutually exlusive. One half of the integral channel formed by the composite elements propagates bubbles while bubbles on the other half of the channel are stationary. Because of bubble-to-bubble repulsion, transfer from one path to the other path of the common channel is conditioned on the absence of bubbles at corresponding positions on the path to which bubbles are to be transferred. Thus the composite channel can be used as a logic correlator. Composite mutually exclusive elements can also be used as a transfer mechanism joining mutually exclusively field-accessed major and minor loops in a memory organization. The circuit elements comprising the loops are noncomposite circuit elements except for a transfer section where the loops are tangent to each other. The transfer section is common to both loops; and in the presence of one set of drive field orientations, the transfer section acts as a part of the minor loop. Under another set of drive field orientations, the transfer section acts as a part of the major loop. Thus bubbles on the minor loop can be circulated into position on the common transfer section by one set of field orientations, and another set of field orientations can subsequently advance the bubbles along the major loop thus completing the transfer. The transfer operation is characterized by the absence of electrical conductors and the absence of special elements used solely for transfer. Only the elements necessary for propagation exclusively on either loop are present in the transfer section. The elements of both loops in the transfer section are superimposed on each other such that certain portions of the elements are shared by the two loops.

A number of new mutually exclusive propagation circuits are introduced, and the principle of composite mutually exclusive elements is extended to these new circuit designs. While the new circuits are designed primarily to propagate in the presence of particular sets of discrete drive field orientations, one class of circuit elements also exhibits the property of discriminating between the two directions of uniformly rotating drive fields.

DESCRIPTION OF THE PREFERRED EMBODIMENTS

Figure 1A:
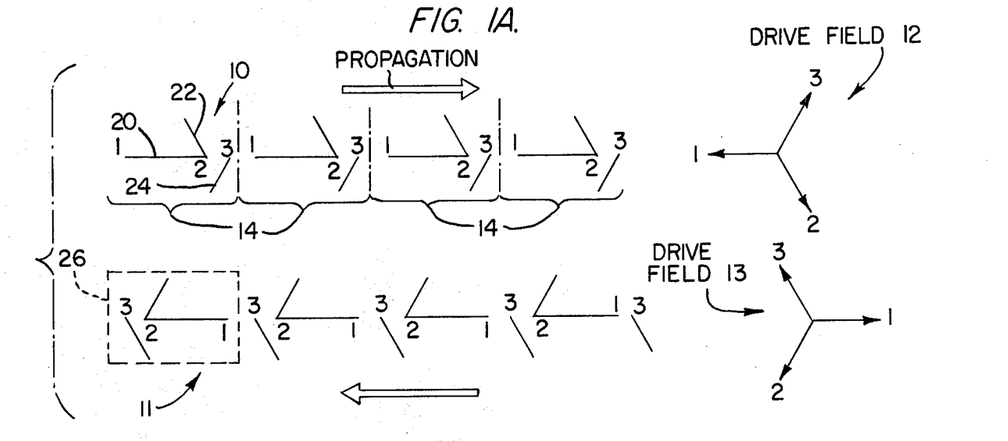
FIGS. 1A and 2-7 are schematic diagrams each illustrating a pair of mutually exclusive bubble channels composed of different types of mutually exclusive elements, according to the invention, and driven respectively by the corresponding set of drive field orientations diagramatically represented in vector form adjacent to each respective channel.

In FIG. 1 a pair of bubble propagation channels 10 and 11 are composed of mutually exclusive circuit elements of soft ferromagnetic overlay material which propagate bubbles in the presence of respective sets of in-plane discrete drive field orientations 12 and 13. Each drive field comprises three sequential vectors separated preferably by approximately 120°. Drive field 13 contains vectors of opposite polarity to those in drive field 12. As a general note for the rest of this disclosure, the illustrated drive field orientations for all of the preferred embodiments (except FIG. 26) are discrete, pulsed vectors. Any given set of discrete field vectors illustrated in the drawings for driving bubbles on a given circuit in this disclosure, always consists of three vectors, consecutively angularly spaced either by 120° as for drive field set 12 (FIG. 1), for example, or by 60° as for drive field set 32 (FIG. 2), for example.

Figure 1B:
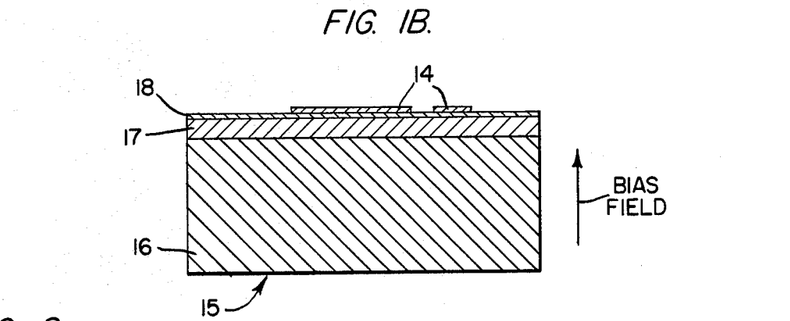
FIG. 1B is a cross-sectional view of a bubble chip.

The channel 10 comprises a plurality of serially arranged elements 14. The circuit elements 14 form part of an otherwise conventional bubble "chip" 15 in FIG. 1B. The chip 15 comprises a substrate 16 of nonmagnetic garnet which supports an epitaxial magnetic bubble garnet layer 17 and spacing layer 18 of silicon oxide to which elements 14 are bonded. The chip is subjected to a static magnetic bias field orthogonal to the plane of the magnetic bubble garnet layer 17 to maintain magnetic bubbles therein. The bubbles are guided by the changing magnetic poles formed in the elements by means of the drive field. The other circuit elements referred to herein are similarly applied to the spacing layer of a bubble chip.

Each element 14 consists of a stem portion 20 having an angled arm 22 at one end making an acute angle with stem 20 and an isolated bar 24 having one end juxtaposed with the junction of the stem 20 and angled arm 22. The isolated bar 24 makes an acute angle with respect to the stem 20 on the opposite side from the angled arm 22. The element 14, nicknamed the "dog-leg" element, resembles the crow-foot element disclosed in the copending application by Bailey and Doerr, with the portion of the stem between the angled arms removed. The elements 14 are arranged serially so that the stems 20 are in alignment. The drive field 12 contains a first field orientation parallel to the stem 20 and pointing away from the junction thereof with the angled arm 22. The second vector in the drive field set 12 points along the angled arm 22 toward its intersection with the stem 20. The third field orientation points along the isolated bar 24 toward the end which is juxtaposed with the junction of the stem 20 and arm 22. The drive field 12 causes attracting poles to be formed at the correspondingly numbered locations along each dog-leg element 14. Thus when the field orientation 1 is pulsed a bubble is attracted to the end of the stem 20 away from the arm 22. The drive field orientation 2 attracts the bubble to the other end of the stem 20 and the orientation number 3 attracts the bubble to the adjacent end of the isolated bar 24. In the next cycle of drive field orientations, the first orientation attracts the bubble from the isolated bar 24 to the adjacent end of the next dog-leg element 14. The rotational order in which the drive field vectors are pulsed determines the direction of propagation on the channel 10.

The channel 11 operated by the drive field 13 is composed of analogous dog-leg elements 26. Each element 26 is symmetrical to the elements 14 of the channel 10 about an axis of symmetry (not shown) perpendicular to the stem 20 of the elements 14. This type of perpendicular symmetry in effect reverses the dog-leg elements 26 with respect to the elements 14 such that bubbles on the elements 26 can not be driven by the drive field 12 but are driven by the drive field 13. Similarly, the drive field 13 is incapable of propagating bubbles on the channel 10. Thus the channels 10 and 11 are mutually exclusively field-accessed by their respective drive field-accessed by their respective drive fields. The numbered bubble positions on channel 11 correspond to the labeled field orientations for drive field set 13. The type of perpendicular symmetry which produces mutually exclusive dog-leg elements is analogous to the perpendicular symmetry discussed in connection with the crow-foot element disclosed in the copending applications by Sandfort and by Bailey and Doerr. Similarly the principle of parallel symmetry discussed in the copending application by Sandfort can be extended in analogous manner to the dog-leg circuit element. Closed triangular or parallel-sided loops can be composed of dog-leg elements in an analogous manner to the techniques disclosed in the above-mentioned copending applications.

Figure 2:
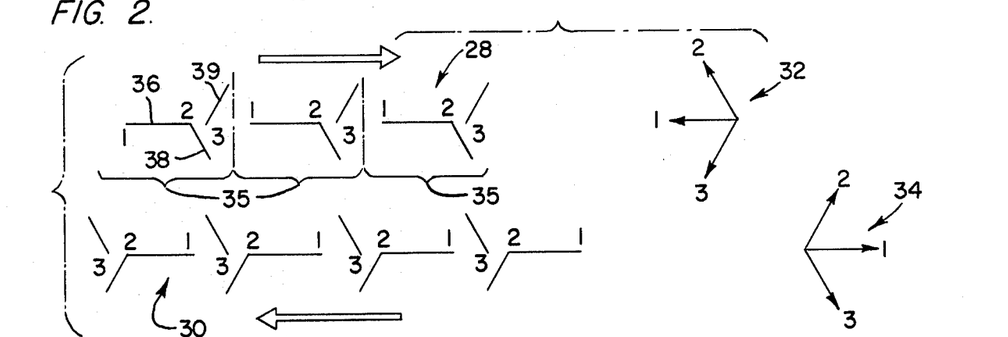

FIG. 2 illustrates a variation on the standard dog-leg circuit of FIG. 1. A pair of mutually exclusive bubble channels 28 and 30 are exclusively field-accessed by means of the corresponding drive field sets 32 and 34. The "alternate" dog-leg element 35 in channel 28 comprises a stem portion 36 with an angled arm 38 at one end making an oblique angle with the stem 36. An isolated bar 39 has one end in juxtaposition with the junction between the arm 38 and stem 36 and also makes an oblique angle on the other side with respect to the stem 36. The corresponding set of sequential drive field orientations 32 comprises a first vector aimed along the stem portion 36 away from the junction thereof with the arm 38, a second vector pointing along the arm 38 toward its junction with the stem 36, and a third vector aligned with the isolated bar 39 directed toward its juxtaposed end. The channel 28 is composed of a plurality of serially arranged alternate dog-leg elements 35 with their stem portions 36 in alignment. Bubbles are advanced to the numbered bubble positions along the channel 28 by application of the correspondingly labeled field vectors 32.

The mutually exclusive channel 30 in FIG. 2 is composed of alternate dog-leg elements having perpendicular symmetry to elements 35 of the channel 28 in a manner analogous to the relationship between elements 26 and 14 in FIG. 1. The numbered bubble positions for the channel 30 correspond to the labeled vectors in the corresponding drive field set 34. As in FIG. 1, the set 34 contains orientations which are opposite to corresponding orientations in the set 32.

Figure 3:
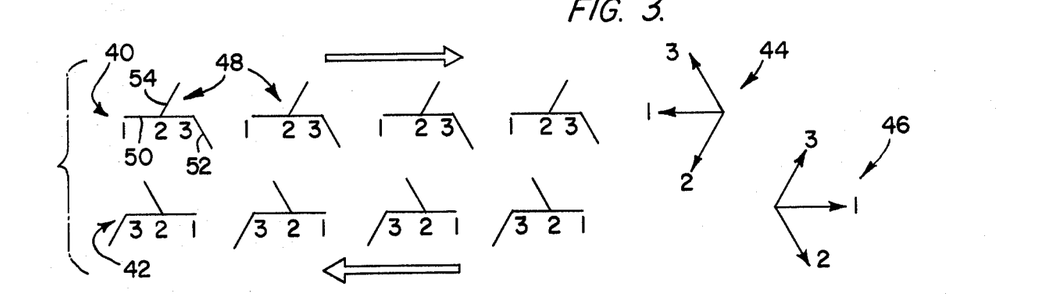

FIG. 3 illustrates a variation on the standard crow-foot circuit element. A pair of mutually exclusive bubble channels 40 and 42 are driven by corresponding drive field sets 44 and 46. Each element 48 of the channel 40 comprises a stem portion 50 with an angled arm 52 at one end making an oblique angle with the stem 50 and intermediate angled arm 54 making a corresponding oblique angle on the other side of the stem 50. The channel 48 is composed of a plurality of serially arranged elements 48 with their stem portions 50 in alignment. The first vector in the set 44 of sequential field orientations is parallel to the stem 50 and points away from its intersection with the arm 52. The second vector points along the intermediate angled arm 54 toward its intersection with the stem 50 and the third vector points along the angled arm 52 toward the other end of the stem 50. Preferably the vectors 2 and 3 make 60° angles with the vector 1. The numbered bubble positions along each element 48 of channel 40 correspond to the labeled field orientations in the set 44. The mutually exclusive channel 32 is composed of individual alternate crow-foot circuit elements in a manner analogous to channel 30 of FIG. 2.

Figure 4:
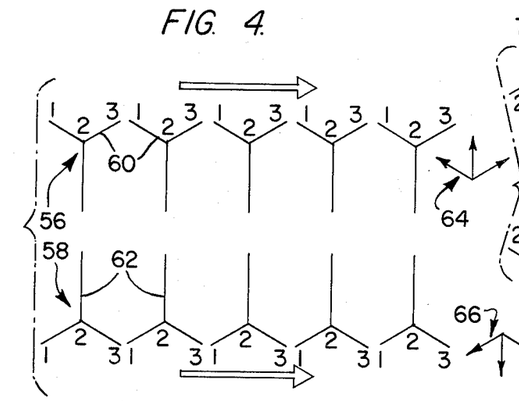

FIG. 4 illustrates a pair of mutually exclusive circuit channels 56 and 58 composed of symmetrical Y-shaped elements 60 and 62 respectively. The radial portions of each Y-shaped element 60, 62 are preferably separated by approximately the same angle, 120°. Channel 56 is driven by the corresponding set of drive field orientations 64 containing a first orientation pointing radially outward along one of the arms of the element 60, a second orientation directed along a second arm toward the intersection of the arms and a third orientation directed radially outward along the third arm of the element 60. Vectors 1 and 3 preferably make 60° angles with the intermediate vector 2. The channel of symmetrical Y-shaped elements is constructed by arranging the elements serially with corresponding portions in parallel and adjacent radial arms in juxtaposition. Attracting poles for advancing bubbles along the channel 56 are numbered in accordance with the drive field set 64. Channel 58 bears perpendicualr symmetry to channel 56 and is driven by the complementary set of drive field orientations 66.

Figure 5:
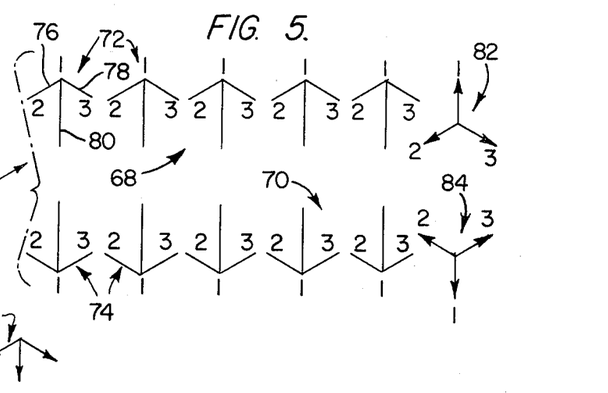

FIG. 5 illustrates a pair of mutually exclusive bubble channels 68 and 70 composed of serially arranged arrow-shaped elements 72 and 74 respectively. Each element 72, 74 comprises a V-shaped head portion having two arms 76 and 78 and a shaft 80 having one end joined to the vertex of the V-shaped head portion. Channels composed of the elements 72 and 74 are constructed by serially arranging the elements with the shaft portions in parallel and adjacent ends of the V-shaped head portions in justaposition. Preferably the V-shaped head portion (76, 78) makes an angle of about 120° which is bisected by the shaft portion 80. The resulting channel resembles bird tracks, hence the nickname "chicken-claw" element. The channel 68 is driven by the corresponding set of drive field orientations 82 containing preferably, three equally angularly spaced sequential vectors. The first field orientation points along the shaft 80 toward the vertex of the head portion of each element. The second vector points along segment 76 away from the vertex, and the third vector points similarly along the other segment 78 away from the vertex such that the bubble is transferred from one chicken-claw element to the next, as indicated by the numbered bubble positions for channel 68. Channel 70 bears perpendicular symmetry to channel 68 and is driven by the complementary set of drive field orientations 84 in a similar manner.

Figure 6:
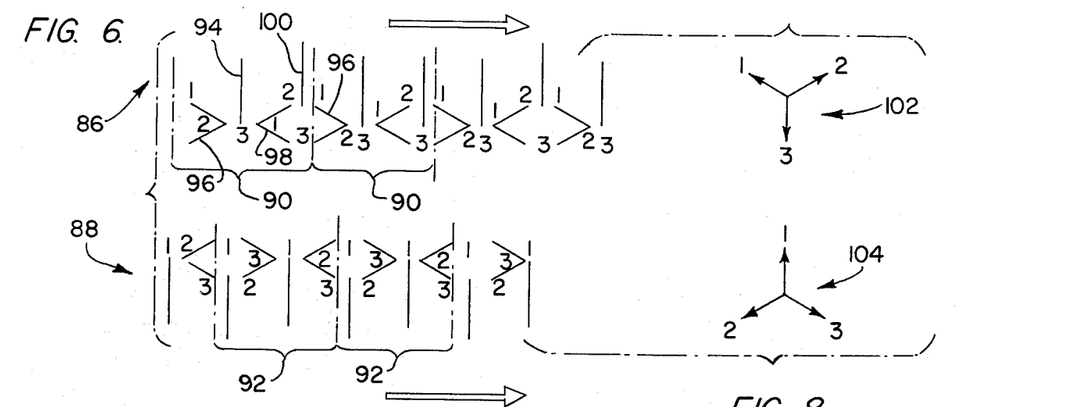

FIG. 6 shows a pair of mutually exclusive bubble channels 86 and 88 composed of mutually exclusive multi-element circuit "units" 90 and 92. In channel 86 a single circuit unit 90 is composed of a first bar element 94, a pair of V-shaped elements 96 and 98 having their vertices juxtposed at one end of the bar element 94. A second bar element 100 parallel but staggered with respect to the bar 94 is juxtposed between adjacent ends of the V-shaped element 98 and the V-shaped element 96 in the next circuit unit 90. A channel of circuit units 90 is composed by arranging the circuit units serially with the V-shaped elements and bars in all of the units in parallel. The channel 86 is operated by the corresponding set of three preferably equally spaced field orientations 102. The first field orientation is parallel to the bars 94 and 100 pointing in the direction of their juxtposed ends. The second field vector points along corresponding segment of each V-shaped element 96 and 98. Similarly the field vector number 3 points along the other corresponding segments of the V-shaped elements 96 and 98. Two cycles of the drive field orientations are necessary for bubbles to traverse one of the circuit units 90. Consider one bubble entering the channel 86 from the left; the first field orientation places the bubble at the upper left-hand end of the V-shaped element 96. The second orientation attracts the bubble to the vertex of the element 96. The third field orientation attracts the bubble to the adjacent end of the bar 94. In the subsequent cycle of the field set 102, the first field vector draws the bubble to the vertex of the V-shaped element 98; the second field vector attracts the bubble to the right-hand upper end of the element 98 and the third vector attracts the bubble to the adjacent end of the bar 100, from which point the "double cycle" is repeated. The elements 92 in channel 88 of FIG. 6 bear perpendicular symmetry to the elements 90 in channel 86. Channel 88 is operated by the complementary corresponding set of drive field orientations 104 in a similar manner. Because of the staggered arrangement of the propagating elements, bubbles traveling on channel 86 or 88 execute a waddle-like motion, hence the nickname "duck-step" circuit.

Figure 7:
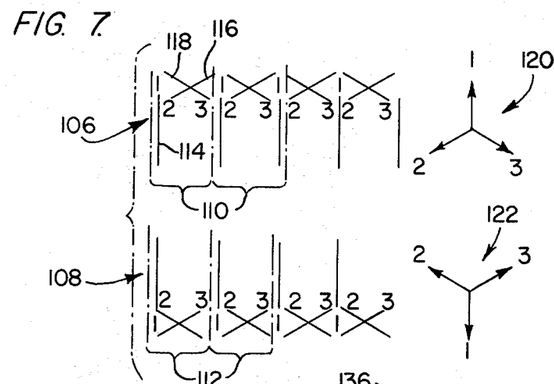

FIG. 7 illustrates a pair of mutually exclusive bubble channels 106 and 108 composed respectively of multi-element circuit units 110 and 112. Circuit unit 110 includes a bar-shaped element 114 and a pair of criss-crossed elements 116 and 118 having their corresponding ends in linear juxtaposition with the corresponding end of the bar 114. In relation to the propagation channel formed by the juxtposed ends of the elements 114, 116 and 118, the bar 114 lies on one side and the crisscrossed elements 116 and 118 lie on the other side. Preferably the elements 114, 116 and 118 all make 120° angles with each other. A circuit channel is constructed by arranging a plurality of so called "X-bar" elements in series such that the juxtaposed ends of all of the elements are in alignment to form an approximately straight line propagation channel. Corresponding portions of each circuit unit 110 are parallel to each other. The channel 106 is driven by the corresponding set of three preferably equally spaced field orientations 120. The first orientation is parallel to the bar 114 pointing toward the propagation path. The second and third field vectors are parallel respectively to crisscrossed elements 116 and 118, and point toward the propagation path. The bubble positions on the channel 106 are numbered in accordance with the labeled field vectors in the set 120. The channel 108 is similarly composed of a series of X-bar circuit units 112 which bear perpendicular symmetry to the elements of channel 106. The channel 108 is operated by a corresponding set of complementary field orientations 122 in a similar manner.

Figure 8:
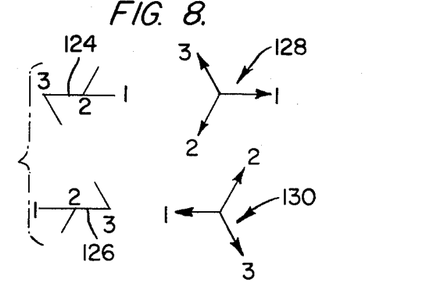
FIG. 8 is a schematic diagram illustrating mutually exclusive crow-foot elements driven respectively by the drive field set adjacent to each element.
Figure 9A:
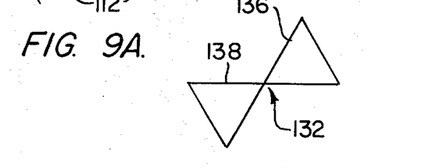
FIGS. 9A and 9B are schematic diagrams illustrating respectively composite circuit elements formed by superimposing one of the crow-foot elements of FIG. 8 on the other.
Figure 9B:
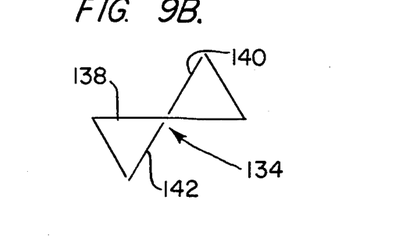

FIG. 8 illustrates a pair of mutually exclusive crow-foot elements 124 and 126 operated by corresponding sets of complementary drive field orientations 128 and 130 in accordance with the teachings of the above-mentioned copending application by Bailey and Doerr. FIGS. 9A and 9B illustrate composite circuit elements 132 and 134, respectively which are recognizable as superimpositions of the two elements 124 and 126 in FIG. 8. In both composite elements 132 and 134 the stem portion 138 is common to the two separate elements 124 and 126 (FIG. 8) which have been superimposed on each other. The element 132 contains no discontinuities; on the other hand, in the element 134, the diagonal line (corresponding to the straight line 36 which crisscrosses stem 138 in the element 132, FIG. 9A) is broken at its ends and at the stem 138 to form two aligned, discrete straight portions 140 and 142 to enhance the pole formation.

Figure 10:
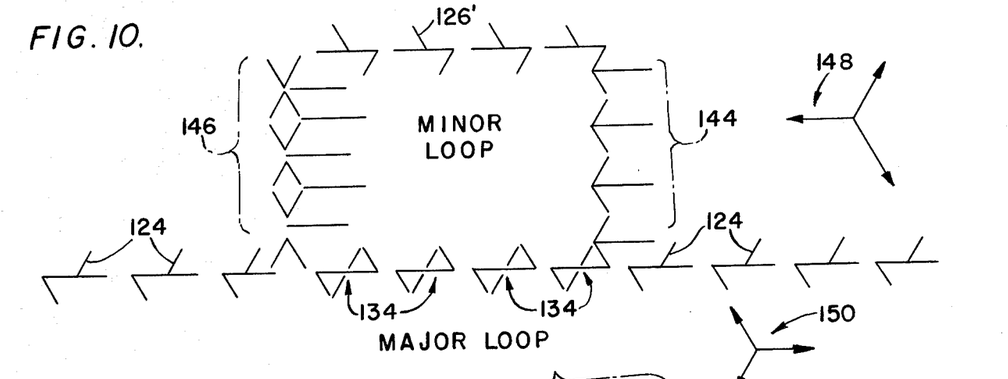
FIG. 10 is a schematic bubble circuit diagram illustrating mutually exclusive major and minor crow-foot loops joined by means of the composite circuit element of FIG. 9B.

FIG. 10 illustrates mutually exclusive major and minor propagation loops. Bubble data would normally be stored in the minor loop and transferred to or from the major loop for readout and write-in. The section of the major loop depicted in FIG. 10 is composed of crow-foot elements 124 (FIG. 8). The minor loop is in the form of a rectangle with the upper side formed by crow-foot elements 126' each of which bears parallel symmetry to elements 126 of FIG. 8 in accordance with the teachings of the above-mentioned copending application by Sandfort. The right and left sides of the minor loop are composed of chicken-claw and duck-step circuits 144 and 146 respectively. The four composite elements 134 are common to both the major and minor loops. Because of the dual structure of the elements 134, these elements contain the necessary crow-foot elements 126 for parallel opposite propagation with respect to elements 126' of the minor loop. Thus the composite element 134 belongs to the minor loop. Yet the elements 134 also include the crow-foot elements 124 within their dual structure and therefore the composite elements 134 also belong to the major loop. In the corresponding set of drive field orientations 148, the major loop will be nonpropagating, while the minor loop will recirculate bubbles, and the composite elements 134 will behave as if they are part of the minor loop. In the corresponding set of complementary field orientation 150, the converse operation occurs: the minor loop is stopped and the major loop propagates bubbles with the composite elements 134 behaving as if they were part of the major loop. It should be noted in particular that the propagation path along the stem of each composite element is the same whether the bubbles are being propagated under the control of field set 148 or 150. Thus no transfer operation is necessary. For example, to write four bubbles bits into the minor loop, the four bit "train" would be advanced along the major loop by means of the drive field set 150 until the train was located on the four corresponding composite elements 134. As this moment the field set 150 would be stopped and the complementary set 148 would be started to control the composite elements 134 as part of the minor loop thus "sidetracking" the four bit train into the minor loop, off of the major loop. The converse of this operation would accomplish readout of the minor loop onto the major loop.

Figures 11, 12, 13:
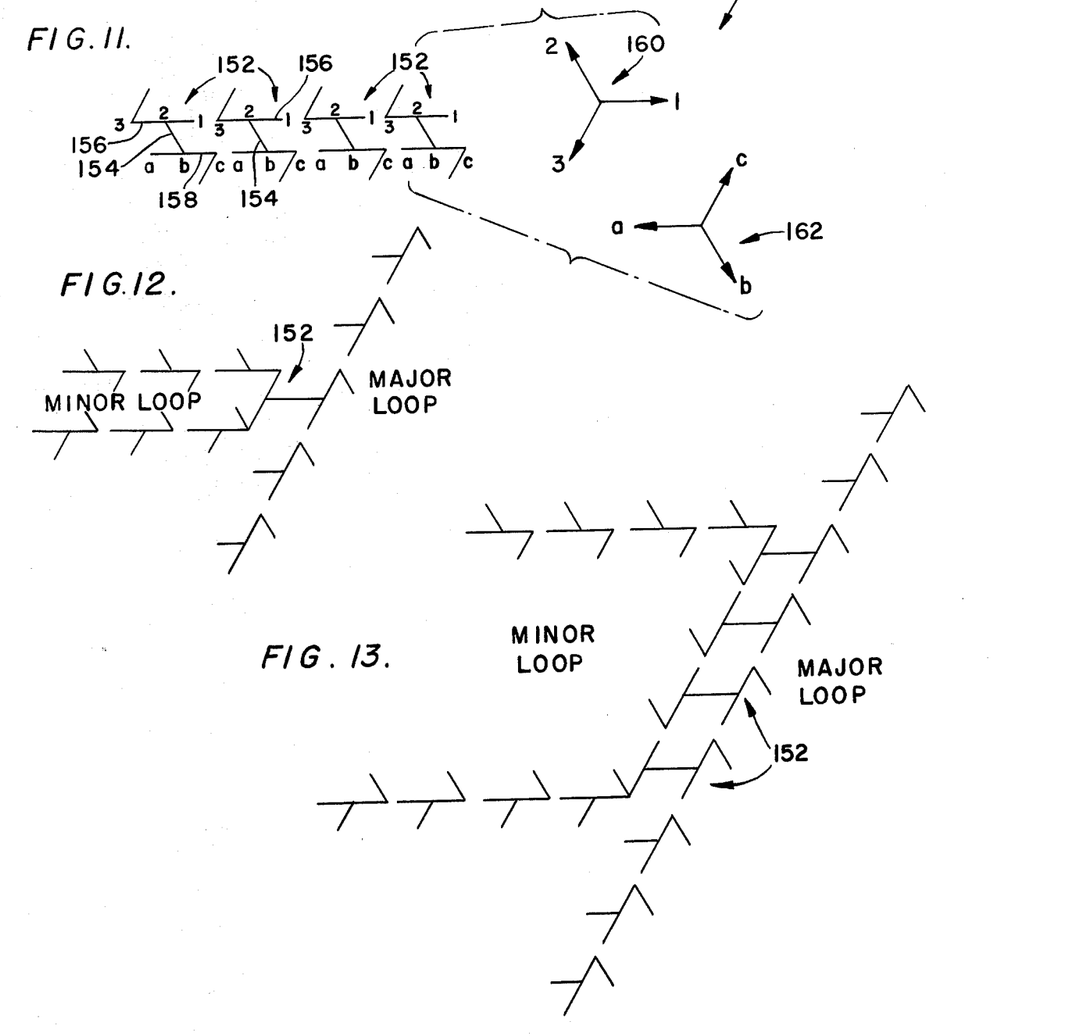
FIG. 11 is a schematic diagram illustrating another form of composite mutually exclusive crow-foot channel having upper and lower paths in which bubbles are propagated exclusively by means of the two complementary sets of drive field orientations indicated in the drawings.
FIG. 12 is a schematic circuit diagram illustrating major and minor crow-foot loops with a single composite transfer element.
FIG. 13 is a schematic diagram illustrating major and minor crow-foot loops with a plurality of composite transfer elements.

FIG. 11 illustrates another kind of composite crow-foot element 152 in which two partially common, mutually exclusive crow-foot elements share an intermediate angled arm 154 that has separate parallel stem portions 156 and 158. Thus joined, the two identifiable crow-foot elements present a single composite element 152. FIG. 11 shows a serial arrangement of identical composite crow-foot elements 152. The upper stems 156 are all in alignment as well as the lower stems 158. The aligned stems 156 form an upper bubble path and the aligned stems 158 form a lower bubble path. The set of drive field orientations 160 operates the upper bubble path in accordance with the correspondingly numbered bubble positions; and the set of complementary field orientations 162 operates the lower path in a similar manner, as indicated by the correspondingly lettered bubble positions. Because of the opposite relationship between drive field sets 160 and 162 which operate the upper and lower bubble paths, the paths, although interconnected, are mutually exclusive. However, bubbles on either path can be transferred via the shared common intermediate arm 154 of each composite element 152. For example, if the lower path or track is operating by virtue of the drive field set 162 and bubbles have just been attracted to the position *b* by means of the vector *b*, switching to the drive field 160, starting with the opposite vector number 2 will cause the bubble on each composite element 152 to traverse the common arm 154 to the bubble position 2 on the upper track and from there to the bubble position 3 as the sequence of the drive field set 160 continues. Transfer can only occur from the lower to the upper track when bubbles on the lower track are at position *b*. If the bubbles are at either position a or c when any one of the orientations in the drive field set 160 for the upper track is pulsed, transfer will not occur. Accordingly, by properly timing the change-over from field set 162 to complementary set 160, transfer or no transfer can be executed on command. Thus the composite elements 152 can behave as two distinct mutually exclusive crow-foot elements or as a single element common to both drive field orientations 160 and 162 depending on the point at which the drive field sets are interchanged.

The transfer operation in FIG. 11 is also determined by the presence of bubbles already on the other track, i.e., the one to which bubbles are to be transferred via the shared element 154. To transfer a bubble, for example, from position b on the lower track to position 2 on the upper track, there cannot be a bubble already at position 1 or 3, or at position 2, on the same stem 156 of the upper track. Bubbles at position 1 or 3 would tend to move to position 2 when vector number 2 was pulsed and thus prevent transfer of a bubble at position b due to magnetic repulsion. Thus, to this extent the transfer operation is a logic function of the positions of bubbles on the two tracks.

FIGS. 12 and 13 illustrate major/minor loop configurations employing respectively a single one and a plurality of composite, shared-arm transfer elements 152. The parallelogram shape of the minor loop indicated in FIGS. 12 and 13 is according to the teachings of the above-mentioned copending application by Sandfort. The systems in FIGS. 12 and 13 operate in a manner analogous to the system which would be presented by replacing the composite element 134 of FIG. 10 with corresponding versions of the composite shared-arm elements 152 of FIG. 11. There is an important distinction, however, between the system actually shown in FIG. 10 and those indicated in FIGS. 12 and 13. In FIG. 10 the major and minor loops are not completely distinct. That is, in order to run a minor loop exclusive of a major loop, the system of FIG. 10 requires that a portion of the major loop be borrowed by the minor loop, and vice versa. In FIGS. 12 and 13, however, the minor loops can be operated completely exclusively of the major loops without using any portion of the major loop, and vice versa. The reason for this, as discussed in connection with FIG. 11, is that transfer from the upper to the lower track is conditional on switching from one field set to the other at the right time. Thus, transfer can be deliberately avoided. In FIGS. 12 and 13, the major loops in this case are operated by the field set 160 of FIG. 11 and the minor loops are operated by the corresponding complementary field set 162 of FIG. 11. In operation, there is an important distinction between the systems of FIGS. 12 and 13. The system of FIG. 12 can only accomplish "serial" transfer, while the system of FIG. 13 can accomplish parallel transfer across a plurality of composite elements 152 at once.

Figure 14:
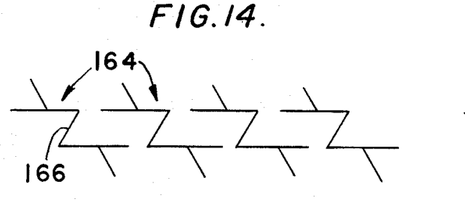
FIGS. 14 and 15 are schematic circuit diagrams illustrating composite crow-foot elements analogous to those in FIG. 11.
Figure 15:
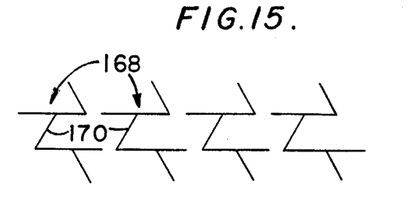

Mutually exclusive elements can be joined in many different ways as shown in FIGs. 14 and 15 for crow-foot composites. A composite crow-foot element 164 (FIG. 14) is formed by two mutually exclusive, recognizable crow-foot elements which share an end arm 166. The elements 164 are arranged in series to provide upper and lower bubble tracks in an analogous manner to the shared intermediate arm composite element 152 of FIG. 11. In FIG. 15 another type of composite element 168 is composed of two recognizable mutually exclusive crow-foot elements in which the intermediate arm of one element is shared as the end arm of the other element, the shared segment being indicated at 170 in FIG. 15. Again the elements 168 are arranged in series to provide upper and lower bubble paths whose operation is similar to that of the circuits of FIGS. 11 and 14.

Figure 16:
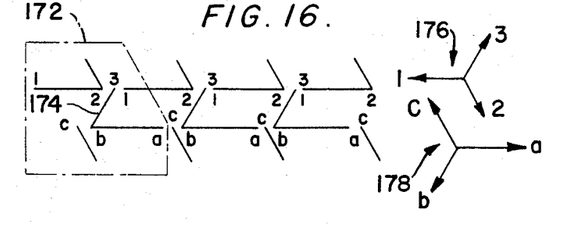
FIG. 16 is a schematic diagram illustrating a composite mutually exclusive circuit combining elements of the type shown in FIG. 1 in a manner analogous to the crow-foot composite elements of FIGS. 11, 14 and 15.
Figure 17:
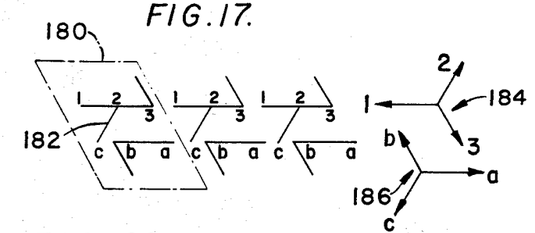
FIGS. 17–20 are schematic diagrams each illustrating composite mutually exclusive circuits composed of both crow-foot elements and the type of element shown in FIG. 1.
Figure 18:
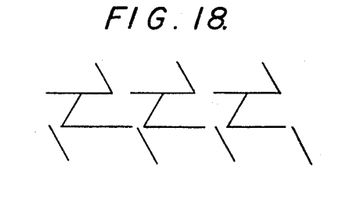
Figure 19:
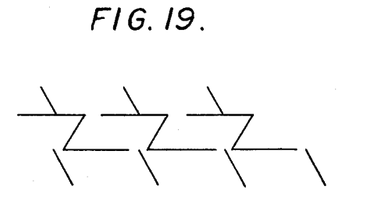
Figure 20:
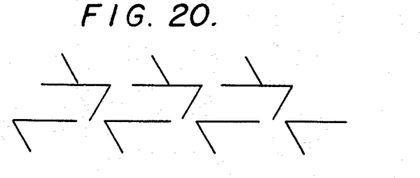

FIG. 16 indicates the analogous treatment for the dog-leg circuit of FIG. 1. The composite circuit unit 172 includes two mutually exclusive dog-leg circuit elements in which the isolated bar of the upper element is shared as the angled end arm 174 of the lower element. The composite elements 172 are arranged in series to form upper and lower tracks as in the crow-foot composite circuits. Propagation on the upper and lower tracks is accomplished respectively by means of the field sets 176 and 178. Transfer, if desired, can be effected, for example, by changing over from one field set to the other from the b to the number 3 vector, and vice versa.

FIGS. 17-20 indicate analogous arrangements in which composite mutually exclusive elements are composed of one crow-foot element and one dog-leg element. For example in FIG. 17 the composite circuit unit 180 is composed of a discretely recognizable crow-foot element and a dog-leg element in which the intermediate arm of the crow-foot element becomes the isolated bar 182 of the lower dog-leg element. The upper and lower tracks are operated by the corresponding complementary field sets 184 and 186 as indicated by the numbered and lettered bubble positions. The transfer operation is similar to that for the composite dog-leg element 172 in FIG. 16.

Figure 21:
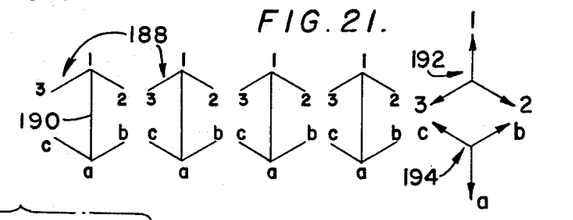
FIGS. 21–24 are schematic circuit diagrams illustrating composite mutually exclusive circuits composed of the type of elements shown in the corresponding figures 4–7.

FIG. 21 illustrates composite chicken-claw circuit elements 188. FIG. 21 corresponds to FIG. 5 but difffers in that channels 68 and 70 of FIG. 5 are joined in FIG. 21 by means of the common shaft 190. Bubbles are propagated through the numbered bubble positions on the upper zigzag by means of the correspondingly numbered drive field set 192. On the lower track, bubbles are propagated through the lettered positions under the control of the corresponding complementary drive field set 194. As in the crow-foot and dog-leg composite elements, the chicken-claw composite element provides a transfer path between the upper and lower path via the common shaft 190 of each element 188. Thus, reversing the vector a in set 194 to begin operation of field set 192 with vector number 1 causes transfer from position a on the lower track to position 1 on the upper track if bubble positions 1, 2 and 3 of the same composite element 188 are not simultaneously occupied.

Figure 22:
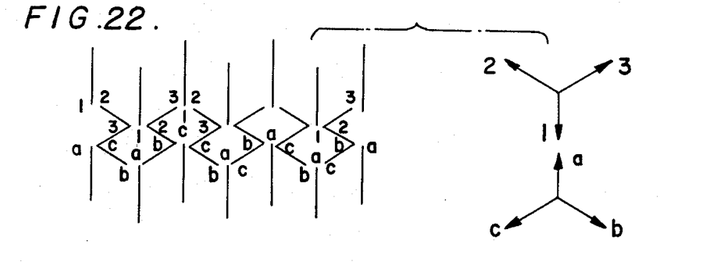
Figure 23:
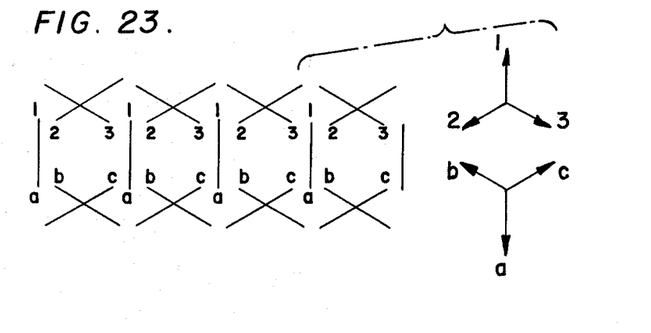
Figure 24:
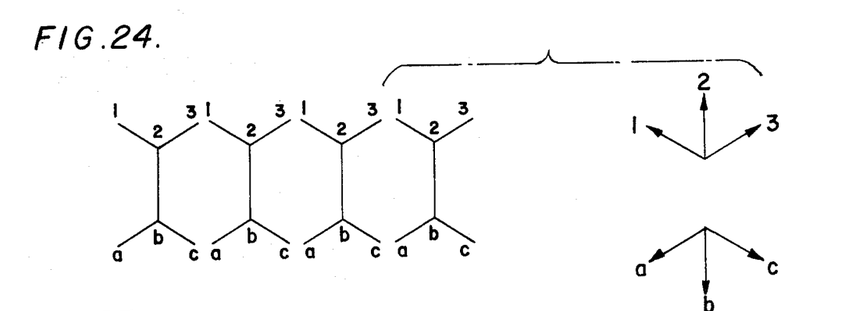

FIGS. 22-24 represent analogous marriages of the upper and lower circuit channels in FIGS. 6, 7 and 4, respectively. The upper and lower bubble tracks in each composite circuit in FIGS. 22-24 are exclusively operated by the upper and lower field sets indicated in each figure. It should be noted, however, that the duck-step system of FIG. 22 provides two different transfer paths between the upper and lower circuits: One between bubble positions 3 and c and the other between bubble positions 2 and b. The only way to positively avoid transfer in the duck-step composite circuit is to stop lower path propagation at positions a before operating the upper path, or to stop upper path propagation at positions 1 before operating the lower path. Of course, as in the other circuits, for transfer to occur, neighboring positions on the track to which transfer is desired must be vacant, as well as the position to which a bubble may be transferred.

Figures 25, 26:
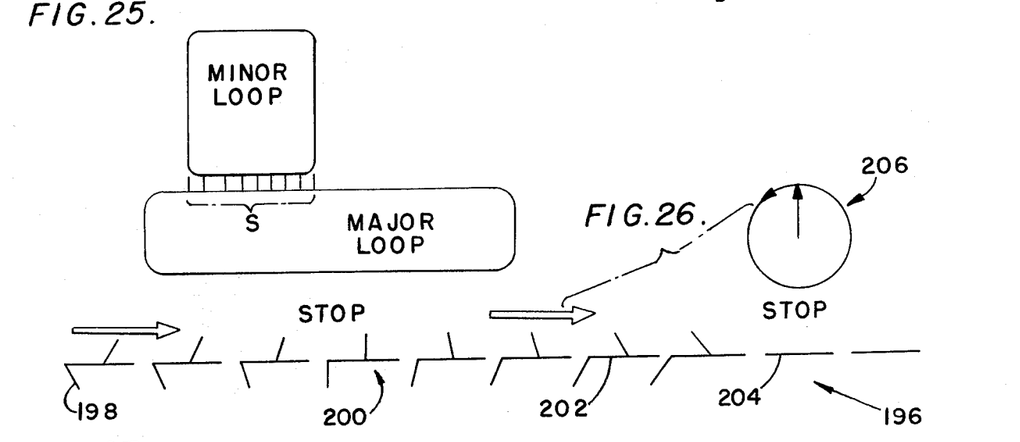
FIG. 25 is a schematic diagram illustrating the relationship between mutually exclusive major and minor loops in general, according to the invention.
FIG. 26 is a schematic diagram illustrating a field-accessed bubble channel composed of discrete circuit elements of progressively varying configurations.

FIG. 25 represents a general diagram of a major/minor loop organization. A common section s joins the major and minor loops. Depending on the type of circuit elements used in the rest of the major and minor loops, any of the composite circuit elements shown in FIGS. 9-24 may be employed to implement the section s permitting exclusive propagation in either the major or the minor loop or field-accessed transfer between the loops. Either one of the loops can have the geometry of a triangle, parallelogram, rectangle or analogous shapes as described in the above-mentioned copending applications by Sandfort and by Bailey and Doerr.

In FIG. 26 a bubble channel 196 starts out on the left-hand end with a standard crow-foot element 198. The arms of the crow-foot element are progressively reoriented in successive increments from element to element to the right of the first element 198. Element 200 for example, has staggered perpendicular arms on either side of the stem portion. To the right of the perpendicular armed element 200, the elements' arms continue to reorient and the elements gradually assume the form of an alternate crow-foot element 202 (c.f., FIG. 3). The arms of the elements continue to flatten out against the stem portion until they disapppear altogether at element 204. Placed under the control of a rotating drive field 206, the circuit 196 exhibits differential behavior along its length. For example, in the vicinity of the standard crow-foot element 198, rightward propagation occurs in the counterclockwise field. Bubbles come to a full stop, however, at element 200 since the poles that are produced in element 200 are nonproductive in propagating bubbles. In the vicinity of the alternate crow-foot element 202, propagation is rightward again under the control of the drive field 206. The drive field is ineffective, however, to propagate bubbles on the straight line elements 204. Thus, in the same circuit there are portions which operate and other portions which fail to operate.

Figure 27:
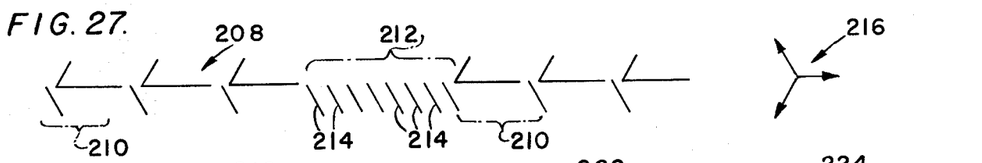
FIG. 27 is a schematic diagram illustrating a field-accessed bubble channel composed of circuit elements like those in FIG. 1 modified in one section to form a bubble compressor.

FIG. 27 illustrates a bubble channel 208 composed of a series of standard dog-leg elements 210, like element 26 in FIG. 1. One section 212 of the channel 208, however, is composed of a plurality of adjacent bars 214, parallel to the isolated bar element of the standard dog-leg element 210. In the sequential drive field set 216, bubbles may be advanced along the standard dog-leg portion of the circuit in either direction. Upon approaching the parallel bar section 212, however, successive bubbles will become stacked up consecutively on the aligned ends of the bars 214. Thus, the channel 208 operates as a bubble compressor. The nonpropagating elements 200 and 204 in FIG. 26 may also serve as a bubble compressors.

Figure 28:
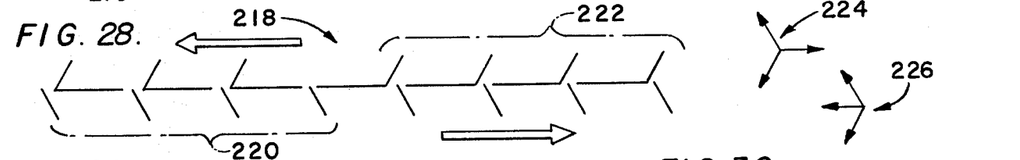
FIGS. 28 and 29 are schematic diagrams illustrating bubble channels in which there is an abrupt change in the type of circuit element at one point along the channel.

FIG. 28 shows a channel 218 composed of a standard dog-leg circuit element section 220 and alternate dog-leg section 222 arranged in series. Section 220 propagates leftward under the control of drive field set 224, and section 222 propagates rightward under the control of the drive field set 226.

Figures 29, 30:
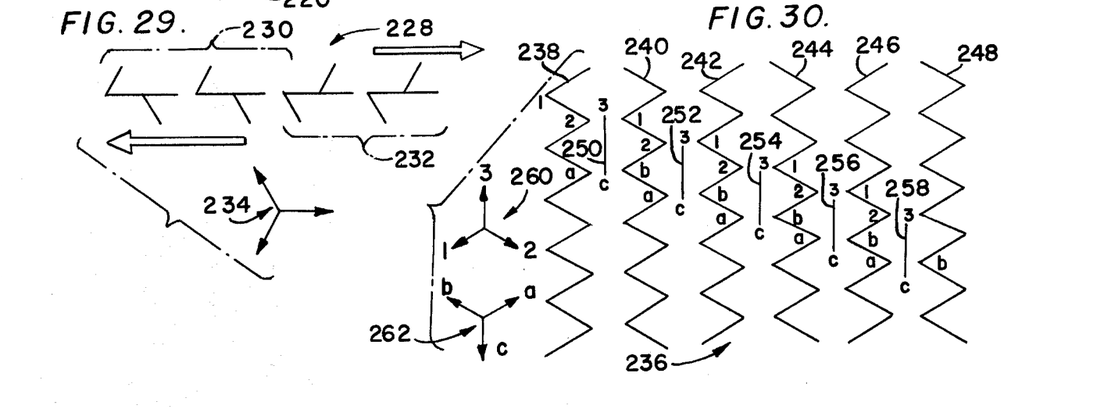
FIG. 30 is a schematic diagram illustrating a honeycomb matrix bubble circuit with parallel zigzag channels.

FIG. 29 illustrates a bubble channel 228 with adjacent sections 230 and 232 composed of standard crow-foot elements having parallel symmetry, respectively, such that under the control of the same drive field 234, section 230 propagates leftward and section 232 propagates rightward.

In FIG. 30 a honeycomb matrix 236 permits propagation in nonparallel directions. The matrix includes six vertical veins of 60° sawtooth continuous, overlay circuits 238, 240, 242, 244, 246 and 248. Alternate veins are parallel and "in phase" for example, veins 238 and 242 and veins 240 and 244. Adjacent veins, for example, 238 and 240 are reversed or 180° out of phase such that if they were sawtooth waveforms they would have opposite polarity. At progressively staggered intervals between successive pairs of adjacent veins, vertical bar elements 250, 252, 254, 256 and 258 are inserted in the matrix 236. Under the control of the sequentially pulsed drive field set 260, any bubble on the veins 238-248, before encountering one of the bars 250-258, advances downward under the control of field vectors 1 and 2, which are aligned with alternate segments of the veins. Upon reaching one of the upper ends of the bars 250-258, a bubble advancing to bubble position 2 on one of the veins will next be attracted to the adjacent end of the bar at bubble position 3 corresponding to field vector 3. The next field vector 1 completes transfer of the bubble to the next adjacent vein of the matrix. As indicated by the numbered bubble positions, this transfer operation will continue until no more vertical bars are encountered at which time the bubble will resume downward propagation.

Diagonal movement on the matrix 236 is dependent on the rotational order of the drive field set 260, which in this case is counterclockwise. If the order of the same field orientations was reversed (e.g., 3, 2, 1), the field vector 1 would follow the field vector 2 and the bubble would continue down the same vein ignoring the presence of the vertical bar. For the complemenetary field set 262 (a,b,c), bubble propagation along the veins would normally be in the upward direction by virtue of the field vectors a and b. As indicated by the progress of the lattered bubble positions, when a bubble propagating upward on the vein 248, for example, encounters the bar 258, the bubble starts a diagonal propagation pattern analogous to that for the bubbles under the control of complementary drive field 260. The diagonal path through the honeycomb matrix 236 will be seen upon inspection to represent another kind of composite mutually exclusive dog-leg circuit. The bubble matrix as illustrated in FIG. 30 has significance for bubble logic and may also be applied in the area of bubble "displays".

Those skilled in the art will recognize that many broad principles are illustrated in this application in the form of specific embodiments which often contain special features that are not critical to the principle employed. For example, the precise angles, lengths, spacing and relative sizes of the elements shown herein are parameters which may be optimized for a particular circuit by conventional methods. In this regard, the pole analysis technique discussed in the above-mentioned copending application by Bailey and Doerr can be used to advantage.

The present embodiments are therefore to be considered in all respects as illustrative and not restrictive, the scope and principle of the invention being indicated by the claims rather than by the foregoing description, and all changes which come within the meaning and range of equivalence of the claims are therefore intended to be embraced therein.

We claim:

1. A bubble propagation system, comprising a sheet of bubble material, means for producing and maintaining bubbles therein, a ferromagnetic overlay pattern operatively disposed on said sheet including a composite circuit element containing overlapping portions which individually define mutually exclusive circuit elements, means for generating first and second sets of different sequential drive field orientations in the plane of said sheet, one of said portions being responsive to only one of said first and second sets for propagating bubbles along said composite circuit elements, and the other of said portions being responsive only to the other one of said first and second sets for propagating bubbles along said composite circuit element.

2. The propagation system of claim 1, wherein said overlay pattern includes a plurality of said composite circuit elements operatively disposed in a serial arrangement defining at least one bubble path.

3. The system of claim 1, wherein the drive field orientations in said first set are of opposite polarity to corresponding drive field orientations in said second set.

4. The system of claim 3, wherein said composite circuit element has a stem portion with parallel angled arms extending from opposite ends thereof at acute angles with said stem portion and at least one straight element disposed between the ends of said angled arms in a direction which crisscrosses said stem portion, whereby a pair of mutually exclusive circuit elements are superimposed such that said stem portion is common to both elements.

5. A bubble propagation system, comprising a sheet of bubble material, means for producing and maintaining bubbles therein, a ferromagnetic overlay pattern operatively disposed on said sheet including at least one composite circuit element containing overlapping portions which individually define mutually exclusive circuit elements defining a pair of distinct mutually exclusive bubble paths, means for generating two sets of sequential drive field orientations in the plane of said sheet, one of said portions being responsive to only one of said sets for propagating bubbles on a corresponding one of said paths, and the other of said portions being responsive only to the other one of said drive field sets for propagating bubbles on the other of said paths.

6. The system of claim 5, wherein the drive field orientations in said first set are opposite in polarity from the drive field orientations in said other set.

7. The propagation system of claim 6, wherein said overlapping portions have at least one common element, said common element being responsive to a predetermined sequence of opposite orientations in said two drive field sets for transferring bubbles from said one path to said other path.

8. The system of claim 7, wherein said overlay pattern includes a plurality of said composite circuit elements serially arranged to define elongated propagation channels corresponding to said two paths.

9. The system of claim 8, wherein each said composite circuit element includes two parallel straight stem portions, an angled arm joined at either end to an intermediate point on each stem portion at acute angles therewith, and parallel angled end arms extending from opposite ends of said stem portions and making acute angles therewith.

10. The propagation system of claim 8, wherein each said composite element includes two mutually exclusive overlapping elements each having a stem portion with an angled arm extending at an acute angle from one end thereof and an intermediate angled arm extending from a point between the ends of said stem, said arms resembling staggered branches, the stem portion of said two elements being parallel and one of said arms of each element being common to both elements.

11. The propagation system of claim 8, wherein each said composite circuit element is in the form of a pair of crow-foot circuit elements having parallel stem portions and one common angled arm interconnecting said parallel stem portions.

12. The propagation system of claim 8, wherein each of said composite elements includes two overlapping mutually exclusive elements, each having the form of a straight stem portion and a pair of angled arms, one of said arms being connected to one end of said stem portion and extending therefrom at an acute angle, the other said arms being isolated and oriented at an acute angle on the other side of said stem and having one end juxtaposed to said one end of said stem portion, said elements having parallel stem portions and one of said arms of each element being common to both elements.

13. The propagation system of claim 8, wherein said composite element includes two different mutually exclusive circuit elements having overlapping common portions, one of said circuit elements including a stem portion and a pair of angled arms, one of said arms of said one element extending at an acute angle from one end of said stem portion and the other said arm of said one element extending from an intermediate point on said stem at an acute angle thereto, said other element including a stem portion and a pair of angled arms, one of the arms of said other element extending from one end of said stem portion thereof at an acute angle and the other of said arms forming an acute angle with said stem on the other side and having one end in juxtaposition with the junction between said one arm and said stem portion of said other element, one of the arms of said one element being provided in common with one of the arms of said other element, said stem portions of said elements being parallel.

14. The propagation system of claim 8, wherein each said composite element includes a pair of opposed V-shaped elements having their vertices joined by a common shaft so as to form a double headed arrow-like configuration.

15. The propagation system of claim 8, wherein each said composite element includes a pair of zigzag elements in spaced opposition such that corresponding vertices of said zigzag elements are in juxtaposition, each said zigzag element having at least three straight segments, a first pair of aligned bars oriented transversely to the segments of said zigzag elements, each of said first pair of bars having one end in juxtaposition with the end of a corresponding segment of one of said zigzag segments and a second pair of aligned bars parallel to said first pair, each one of said second pair of bars having one end in juxtaposition with the ends of corresponding segments between said zigzag elements.

16. The propagation system of claim 8, wherein said composite element includes a straight bar and a pair of opposed parallel X-shaped configurations to one side of said bar, one end of said bar and adjacent ends of the corresponding X-shaped configuration being juxtaposed in alignment and the other end of said bar and the adjacent ends of the other corresponding X-shaped configuration being juxtaposed in alignment, said bar being approximately parallel to the geometric bisector of said X-shaped configurations.

17. The propagation system of claim 8, wherein each said composite element includes a pair of opposed V-shaped elements having their vertices interconnected by a common shaft so as to form a double Y-configuration.

18. A bubble circuit, comprising a sheet of magnetic bubble material, means for producing and maintaining bubbles therein, a ferromagnetic overlay pattern operatively disposed on said sheet including a serially arranged plurality of composite circuit elements including overlapping portions of mutually exclusive circuit elements forming a pair of corresponding mutually exclusive bubble paths, means for generating sets of different drive field orientations in the plane of said sheet, corresponding ones of said overlapping mutually exclusive elements being responsive to only one of said sets for propagating bubbles along one of said paths and corresponding other ones of said overlapping mutually exclusive elements being responsive to only the other one of said sets of drive fields for propagating bubbles along said other path, said overlapping mutually exclusive elements in each said composite element having a common portion responsive to a predetermined sequence of orientations of said sets for transferring bubbles between a first bubble position on said one path to a second bubble position on said other path.

19. A bubble circuit, comprising a sheet of magnetic bubble material, means for producing and maintaining bubbles therein, a ferromagnetic overlay pattern including a first bubble path having a plurality of serially arranged identical mutually exclusive circuit elements and a second bubble bath parallel to the first path having a plurality of serially arranged identical mutually exclusive circuit elements, means for generating two sets of different drive field orientations in the plane of said sheet, the elements comprising said first path being responsive to only one of said sets of drive field for propagating bubbles on said first path, and the elements of said second path being responsive to only the other one of said sets of drive fields for propagating bubbles on said second path, corresponding ones of said mutually exclusive elements in said first and second paths having common portions, said common portions being responsive to a predetermined sequence of said first and second sets of drive fields for transferring bubbles from one of said paths to the other path.

20. The circuit of claim 19, wherein said first and second paths form distinct closed propagation loops.

21. A field-accessed bubble propagation system, comprising a sheet of magnetic bubble material, means for producing and maintaining bubbles therein, a ferromagnetic overlay circuit operatively disposed on said sheet including first and second independent bubble circuits sharing a common circuit section, means for generating a reorienting magnetic drive field in the plane of said sheet to propagate bubbles along said first circuit without propagating bubbles along said second circuit or to propagate bubbles along said second circuit without propagating bubbles along said first circuit and to selectively transfer bubbles between said first and second circuits via said common section solely by action of said reorienting drive field on said overlay circuit, at least one of said first and second circuits being a recirculating closed loop circuit.

22. A field-accessed bubble propagation system, comprising a sheet of magnetic bubble material, means for producing and maintaining bubbles therein, a ferromagnetic overlay circuit operatively disposed on said sheet including first and second independent bubble circuits sharing a common circuit section, means for generating a reorienting magnetic drive field in the plane of said sheet to propagate bubbles along one or the other of said circuits and to selectively transfer bubbles between said first and second circuits via said common section solely by action of said reorienting drive field in said overlay circuit, said common circuit section consisting of composite circuit elements which serve alternatively as a part of either said first or second bubble circuit depending on the manner in which said drive field is reoriented, said composite circuit elements having common portions through which transfer is accomplished.

23. A bubble propagation system, comprising a sheet of bubble material, means for producing and maintaining bubbles therein, a ferromagnetic overlay pattern operatively disposed on said sheet defining a straight bubble path, said path having at least two colinear portions composed of different circuit elements, means for generating a reorienting drive field in the plane of said sheet, said different circuit elements being responsive to said drive field for propagating bubbles simultaneously in opposite directions respectively in said two portions of said straight path.

24. A bubble propagation system, comprising a sheet of magnetic bubble material, means for producing and maintaining bubbles therein, a ferromagnetic overlay pattern operatively disposed on said sheet defining a bubble path having two portions composed of different circuit elements, the elements of said path being arranged to receive a propagated bubble in sequence, means for generating a reorienting drive field in the plane of said sheet, the elements in only one of said portions being responsive to said drive field for propagating bubbles in said corresponding one portion.

25. A field-accessed bubble propagation system, comprising a sheet of magnetic bubble material, means for producing and maintaining bubbles therein, a ferromagnetic overlay circuit pattern operatively disposed on said sheet including at least one discrete element having a straight stem portion with an arm extending from one end thereof at an acute angle and an isolated arm oriented at an acute angle with said stem portion on the other side thereof having an adjacent end in spaced juxtaposition with said one end of said stem, and means for applying a magnetic drive field in the plane of said sheet to propagate bubbles along said stem portion to said adjacent end of said isolated arm.

26. The system of claim 25, wherein said means for applying said drive field includes means for generating a predetermined sequence of discrete pulsed drive field orientations aligned respectively with said stem portion and said angled arms such that attracting magnetic poles are formed consecutively along said stem portion and at said adjacent end of said isolated arm.

27. A field-accessed bubble propagation system, comprising a sheet of magnetic bubble material, means for producing and maintaining bubbles therein, a ferromagnetic overlay circuit operatively disposed on said sheet including at least one discrete element having a straight stem portion with an arm extending at an oblique angle from one end thereof and an isolated arm oriented at an oblique angle with said stem portion on the other side thereof and having an adjacent end in spaced juxtaposition with said one end of said stem portion, and means for applying a magnetic drive field in the plane of said sheet to propagate bubbles along said stem portion to said adjacent end of said isolated arm.

28. The system of claim 27, wherein said means for applying said drive field includes means for generating a predetermined sequence of discrete pulsed drive field orientations aligned respectively with said stem portion and said angled arms such that attracting magnetic poles are formed consecutively along said stem portion and at said adjacent end of said isolated arm.

29. A field-accessed bubble propagation system, comprising a sheet of magnetic bubble material, means for producing and maintaining bubbles therein, a ferromagnetic overlay circuit operatively disposed on said sheet including at least one discrete element having a straight stem portion with an angled arm extending from one end thereof at an oblique angle and another angled arm extending from an intermediate point on said stem portion forming a corresponding oblique angle on the other side thereof, and means for applying a magnetic drive field in the plane of said sheet to propagate bubbles along said stem portion.

30. The system of claim 29, wherein said means for applying said drive field includes means for generating a predetermined sequence of discrete pulsed drive field orientations aligned respectively with said stem portion and said angled arms such that attracting magnetic poles are formed consecutively along said stem portion.

31. A field-accessed bubble propagation system, comprising a sheet of magnetic bubble material, means for producing and maintaining bubbles therein, a ferromagnetic overlay circuit operatively disposed on said sheet including a plurality of parallel, serially arranged discrete elements each in the shape of an arrow having a V-shaped portion and a shaft joined to the vertex of said V-shaped portion, adjacent ends of the V-shaped portions of successive ones of said elements being juxtaposed and means for applying a predetermined sequence of discrete pulsed drive field orientations aligned respectively with the segments of said V-shaped portion and said shaft of each element such that attracting magnetic poles are formed consecutively along said V-shaped portion of each element to propagate bubbles.

32. A field-accessed bubble propagation system, comprising a sheet of magnetic bubble material, means for producing and maintaining bubbles therein, a ferromagnetic overlay circuit operatively disposed on said sheet including at least one multielement circuit unit comprising a pair of opposed V-shaped elements with juxtaposed vertices having corresponding parallel sides and a pair of parallel isolated bars, one of said bars having one end disposed between the juxtaposed vertices of said V-shaped elements and the other bar having a corresponding end in juxtaposition with the one end of one of said V-shaped elements, said parallel bars being oriented traversely with respect to said V-shaped elements, and means for generating a predetermined sequence of discrete pulsed drive field orientations aligned respectively with the parallel segments of said V-shaped elements and said bars such that attracting magnetic poles are formed consecutively at the ends of the segments of said V-shaped elements and at the corresponding ends of said bars to propagate bubbles.

33. A field-accessed bubble propagation system, comprising a sheet of magnetic bubble material, means for producing and maintaining bubbles therein, a ferromagnetic overlay circuit operatively disposed on said sheet including at least one multielement circuit unit including a straight bar and an X-shaped element, corresponding ends of said bar and said X-shaped element being juxtaposed in alignment, said straight bar being oriented transversely with respect to said X-shaped element, and means for generating a predetermined sequence of discrete pulsed drive field orientations aligned respectively with said straight bar and the segments of said X-shaped element such that attracting magnetic poles are formed consecutively along the aligned ends of said bar and said X-shaped element to propagate bubbles.

* * * * *